(12) United States Patent
Yoshiike et al.

(10) Patent No.: US 10,081,161 B2
(45) Date of Patent: Sep. 25, 2018

(54) ELECTRONIC DEVICE AND MANUFACTURING METHOD OF ELECTRONIC DEVICE

(71) Applicant: SEIKO EPSON CORPORATION, Tokyo (JP)

(72) Inventors: Masashi Yoshiike, Chino (JP); Tomoyoshi Saito, Chino (JP)

(73) Assignee: Seiko Epson Corporation, Tokyo (JP)

( * ) Notice: Subject to any disclaimer, the term of this patent is extended or adjusted under 35 U.S.C. 154(b) by 79 days.

(21) Appl. No.: 15/001,893

(22) Filed: Jan. 20, 2016

(65) Prior Publication Data

US 2016/0257093 A1 Sep. 8, 2016

(30) Foreign Application Priority Data

Mar. 5, 2015 (JP) ................. 2015-043353

(51) Int. Cl.
*B32B 7/12* (2006.01)
*B32B 37/14* (2006.01)
(Continued)

(52) U.S. Cl.
CPC ................. *B32B 7/12* (2013.01); *B32B 3/08* (2013.01); *B32B 7/14* (2013.01); *B32B 27/08* (2013.01);
(Continued)

(58) Field of Classification Search
CPC .......... B32B 7/12; B32B 3/08; B32B 27/283; B32B 7/14; B32B 27/08; B32B 37/12; B32B 37/14; B32B 2255/10; B32B 2457/14; B32B 2255/205; B32B 2255/26; B32B 2310/0806; B32B 2305/72; B32B 2457/00; B41J 2/1645; B41J 2/1623; B41J 2/1626; B41J 2/1635; B41J 2/14233;
(Continued)

(56) References Cited

U.S. PATENT DOCUMENTS

| 4,707,570 A * | 11/1987 | Ide ........................ G06F 3/047 178/18.05 |
| 6,556,189 B1 * | 4/2003 | Takahata ................. G06F 3/041 178/18.03 |

(Continued)

FOREIGN PATENT DOCUMENTS

| JP | 2006295127 | 10/2006 |
| JP | 2010-221508 A | 10/2010 |

(Continued)

*Primary Examiner* — David Sample
*Assistant Examiner* — Donald M Flores, Jr.
(74) *Attorney, Agent, or Firm* — Workman Nydegger

(57) ABSTRACT

A manufacturing method of an electronic device includes a first stacking process of forming a first photosensitive adhesive on a surface on a second substrate side in a first substrate; and a second stacking process of forming a second photosensitive adhesive, which overlaps the first photosensitive adhesive, having a lower degree of cure than that of the first photosensitive adhesive; and a bonding process of bonding together the first substrate and the second substrate by curing the second photosensitive adhesive by heating, in a state in which the first photosensitive adhesive and the second photosensitive adhesive are interposed between the first substrate and the second substrate.

6 Claims, 7 Drawing Sheets

(51) Int. Cl.
   *B32B 37/12*   (2006.01)
   *B32B 7/14*    (2006.01)
   *B32B 27/08*   (2006.01)
   *B32B 27/28*   (2006.01)
   *B32B 3/08*    (2006.01)
   *B41J 2/14*    (2006.01)
   *B41J 2/16*    (2006.01)

(52) U.S. Cl.
   CPC ............ *B32B 27/283* (2013.01); *B32B 37/12* (2013.01); *B32B 37/14* (2013.01); *B41J 2/14233* (2013.01); *B41J 2/161* (2013.01); *B41J 2/1623* (2013.01); *B41J 2/1626* (2013.01); *B41J 2/1631* (2013.01); *B41J 2/1632* (2013.01); *B41J 2/1635* (2013.01); *B41J 2/1645* (2013.01); *B41J 2/1646* (2013.01); *B32B 2255/10* (2013.01); *B32B 2255/205* (2013.01); *B32B 2255/26* (2013.01); *B32B 2305/72* (2013.01); *B32B 2310/0806* (2013.01); *B32B 2457/00* (2013.01); *B32B 2457/14* (2013.01); *B41J 2002/14419* (2013.01); *B41J 2002/14491* (2013.01)

(58) Field of Classification Search
   CPC ...... B41J 2/1646; B41J 2/1631; B41J 2/1632; B41J 2/161; B41J 2002/14419; B41J 2002/14491
   See application file for complete search history.

(56) References Cited

U.S. PATENT DOCUMENTS

| | | | |
|---|---|---|---|
| 7,605,878 B2* | 10/2009 | Ohtake | G06F 3/045 349/153 |
| 2006/0228829 A1 | 10/2006 | Hsu | |
| 2014/0246148 A1* | 9/2014 | Liu | C09J 5/00 156/275.5 |
| 2015/0270304 A1 | 9/2015 | Saito | |

FOREIGN PATENT DOCUMENTS

| | | |
|---|---|---|
| JP | 2012209596 | 10/2012 |
| JP | 2014-051008 A | 3/2014 |
| JP | 2014120573 | 6/2014 |

* cited by examiner

ELECTRONIC DEVICE AND MANUFACTURING METHOD OF ELECTRONIC DEVICE

BACKGROUND

1. Technical Field

The present invention relates to an electronic device including a photosensitive adhesive which is interposed between two substrates and bonds the two substrates, and a manufacturing method of the electronic device.

2. Related Art

An electronic device includes a piezoelectric element or the like which is deformed by a voltage that is applied, and is used for various devices, various sensors, or the like. For example, in a liquid ejecting apparatus, liquid of various types is ejected from a liquid ejecting head which uses an electronic device. The liquid ejecting apparatus includes an image recording apparatus such as, an ink jet type printer or an ink jet type plotter, but recently, the liquid ejecting apparatus has been also used for various manufacturing apparatuses by utilizing features in which a very small amount of liquid can be correctly landed on a predetermined position. For example, the electronic device is used for, for example, a display manufacturing apparatus which manufactures a color filter such a liquid crystal display, an electrode forming apparatus which forms electrodes of an organic electro luminescence (EL) display, a field emission display (FED), or the like, and a chip manufacturing apparatus which manufactures a biochip (biochemical element). Then, a recording head for an image recording apparatus ejects ink of liquid type, and a color material ejecting head for a display manufacturing apparatus ejects solutions of each color material of red (R), green (G), and blue (B). In addition, an electrode material ejecting head for an electrode forming apparatus ejects an electronic material of liquid type, and a bio-organic substance ejecting head for a chip manufacturing apparatus ejects a solution of a bio-organic substance.

The liquid ejecting head includes a pressure chamber forming substrate in which a pressure chamber communicating with a nozzle is formed, a piezoelectric element (a type of a drive element) which causes a pressure change to occur in liquid within a pressure chamber, and an electronic device in which a sealing plate or the like that is disposed so as to be separated from the piezoelectric element with an interval is stacked. In recent years, a technology has been developed in which a drive circuit (also referred to as a driver circuit) for driving an piezoelectric element is provided on the sealing plate. The sealing plate is bonded to a pressure chamber forming substrate in which a piezoelectric element is stacked, in a state in which a bump electrode is interposed therebetween (for example, JP-A-2014-51008). As a result, the drive circuit and the piezoelectric element are electrically coupled to each other through the bump electrode.

In addition, a technology is developed in which an adhesive (photosensitive adhesive) configured by a resin or the like with photosensitivity is used for the above adhesive. If such an adhesive is used, one substrate is first coated with an adhesive of liquid type by using a spin coater or the like, and the adhesive is cured to a certain degree by heating. Then, by performing exposure and development, the adhesive is patterned in a predetermined position. Thereafter, by attaching the other substrate so as to face the one substrate, curing the adhesive by heating again, and thereby both the substrates are bonded together. As a result, the adhesive can be correctly patterned in a predetermined position.

If the above-described photosensitive adhesive is used, it is possible to prevent a shape after development from being collapsed, and thus a degree of cure is performed to a certain degree of cure. For this reason, when both the substrates are bonded together, adhesion (that is, bonding strength) to the other substrate by an adhesive decreases. Particularly, if there is roughness on a surface (adhered surface) of the substrate, adhesiveness of the adhesive decreases, the adhesion remarkably decreases.

SUMMARY

An advantage of some aspects of the invention is to provide an electronic device which can increase bonding strength between substrates using an adhesive, and a manufacturing method of the electronic device.

According to the invention, a manufacturing method of an electronic device including a first substrate and a second substrate which is bonded to the first substrate in a state in which a first photosensitive adhesive and a second photosensitive adhesive are interposed between the first substrate and the second substrate, includes forming the first photosensitive adhesive on the first substrate; providing the second photosensitive adhesive, which overlaps the first photosensitive adhesive, having a lower degree of cure than that of the first photosensitive adhesive; and bonding together the first substrate and the second substrate by curing the second photosensitive adhesive by heating, in a state in which the first photosensitive adhesive and the second photosensitive adhesive are interposed between the first substrate and the second substrate.

According to the method, since the second photosensitive adhesive with a lower degree of cure than that of the first photosensitive adhesive is formed on the first photosensitive adhesive, it is possible to increase bonding strength between the first substrate and the second substrate using the second photosensitive adhesive. That is, even though cure reaction of the first photosensitive adhesive is performed in order to increase patterning accuracy of the adhesive, adhesion can be ensured by the second photosensitive adhesive. As a result, it is possible to achieve an increase of patterning accuracy of a photosensitive adhesive, and an increase of bonding strength.

In addition, in the above method, it is preferable that the manufacturing method of the electronic device further includes forming a third photosensitive adhesive with a higher degree of cure than that of the second photosensitive adhesive, in the second substrate, in a state in which the third photosensitive adhesive is interposed between the second photosensitive adhesive and the second substrate, in which the bonding includes curing the second photosensitive adhesive by heating, in a state in which the second photosensitive adhesive comes into close contact with the third photosensitive adhesive.

According to the configuration, the second substrate is coated with the third photosensitive adhesive, and thus it is possible to reliably ensure bonding strength between the second substrate and the third photosensitive adhesive. In addition, since the first substrate and the second substrate are bonded together by adhering of the second photosensitive adhesive and the third photosensitive adhesive, that is, adhering between the adhesives, it is possible to more increase the bonding strength between the first substrate and the second substrate.

Furthermore, in the above method, it is preferable that the manufacturing method further includes forming a third photosensitive adhesive with a higher degree of cure than that of the second photosensitive adhesive, in the second substrate, in a state in which the third photosensitive adhesive is interposed between the second photosensitive adhesive and the second substrate; and providing another second photosensitive adhesive which overlaps the third photosensitive adhesive, in which the bonding includes curing both the second photosensitive adhesives by heating, in a state in which the second photosensitive adhesive that is provided on the first substrate comes into close contact with the second photosensitive adhesive that is provided on the second substrate.

According to the configuration, the second substrate is coated with the third photosensitive adhesive, and thus it is possible to reliably ensure bonding strength between the second substrate and the third photosensitive adhesive. In addition, since the first substrate and the second substrate are bonded together by adhering between the second photosensitive adhesives, it is possible to more increase the bonding strength between the first substrate and the second substrate.

In addition, an electronic device according to the invention includes a first substrate; a first photosensitive adhesive which is formed on the first substrate; a second photosensitive adhesive which is provided so as to overlap the first photosensitive adhesive; and a second substrate which is bonded to the first substrate, in a state in which the first photosensitive adhesive and the second photosensitive adhesive are interposed between the first substrate and the second substrate. The second photosensitive adhesive is formed between the first substrate and the second substrate such that at least a portion of the second photosensitive adhesive expands on an outer side more than the first photosensitive adhesive.

Furthermore, in the above configuration, it is preferable that a third photosensitive adhesive is included between the second photosensitive adhesive and the second substrate.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments for implementing the invention will be described with reference to the accompanying drawings. In the embodiments to be hereinafter described, various limitations may be made as preferred specific examples of the invention, but the scope of the invention is not limited to the examples, as long as there is no description of gist that particularly limits the invention in the following description. In addition, hereinafter, an ink jet type printer (hereinafter, referred to as a printer) which is a type of a liquid ejecting apparatus to which an ink jet type recording head (hereinafter, referred to as a recording head) which is a type of a liquid ejection head having an electronic device according to the invention is mounted, will be used as an example.

Figure 1:
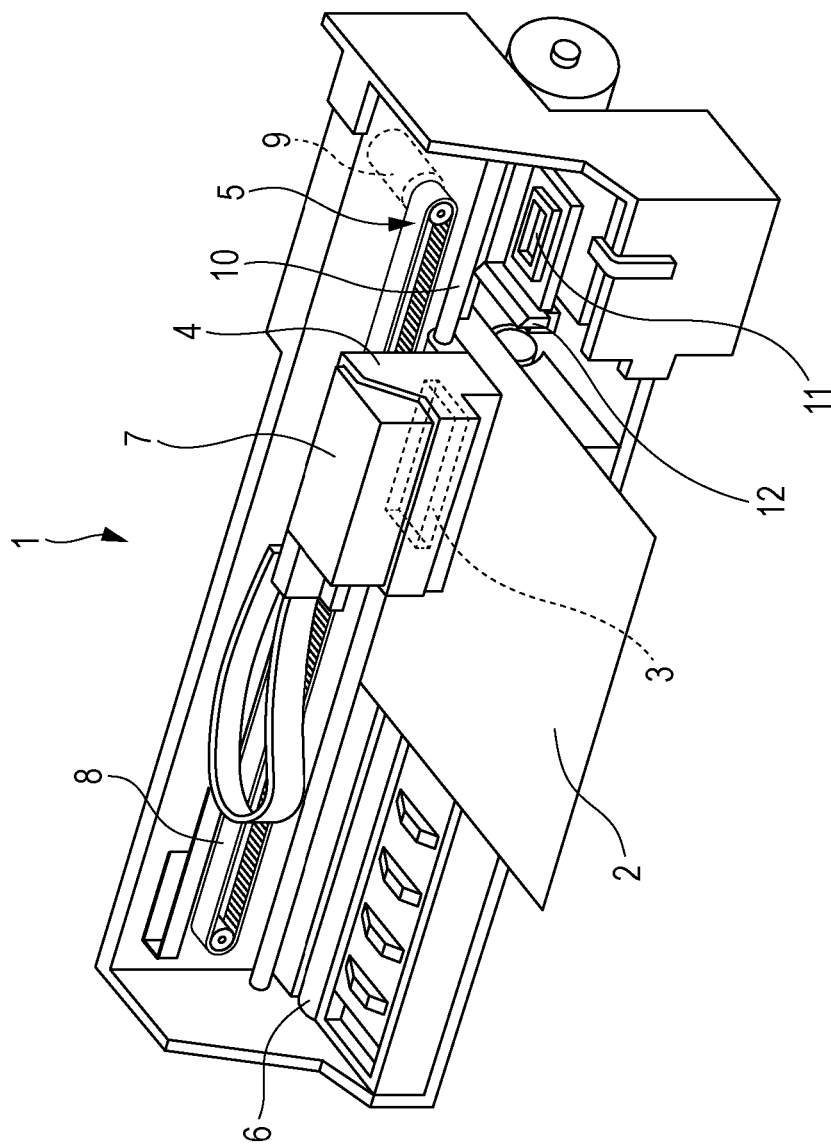
FIG. 1 is a perspective view illustrating a configuration of a printer.

A configuration of a printer 1 will be described with reference to FIG. 1. The printer 1 performs recording of an image or the like by ejecting ink (a type of liquid) onto a surface of a recording medium 2 (a type of a landing target) such as a recording paper. The printer 1 includes a recording head 3, a carriage 4 to which the recording head 3 is attached, a carriage moving mechanism 5 which moves the carriage 4 in a main scanning direction, a transport mechanism 6 which transports the recording medium 2 in a sub-scanning direction, and the like. Here, the ink is stored in an ink cartridge 7 that is a liquid supply source. The ink cartridge 7 is detachably mounted in the recording head 3. The ink cartridge is disposed on a body side of the printer, and it is possible to employ a configuration in which the ink is supplied to the recording head from the ink cartridge through an ink supply tube.

The carriage moving mechanism 5 includes a timing belt 8. The timing belt 8 is driven by a pulse motor 9 such as a DC motor. Thus, if the pulse motor 9 operates, the carriage 4 is guided by a guide rod 10 which is installed in the printer 1, and moves back and forth in the main scanning direction (sub-direction of the recording medium 2). A position of the main scanning direction of the carriage 4 is detected by a linear encoder (not illustrated) which is a type of positional information detecting means. The linear encoder transmits the detected signal, that is, an encoder pulse (a type of positional information) to a control unit of the printer 1.

In addition, a home position which becomes a base point of the scanning of the carriage 4 is set in an end portion area on an outer side more than a recording area within a moving range of the carriage 4. A cap 11 which seals a nozzle 22 formed on a nozzle surface (nozzle plate 21) of the recording head 3, and a wiping unit 12 for expanding the nozzle surface are sequentially disposed in the home position from an end portion side.

Figure 2:
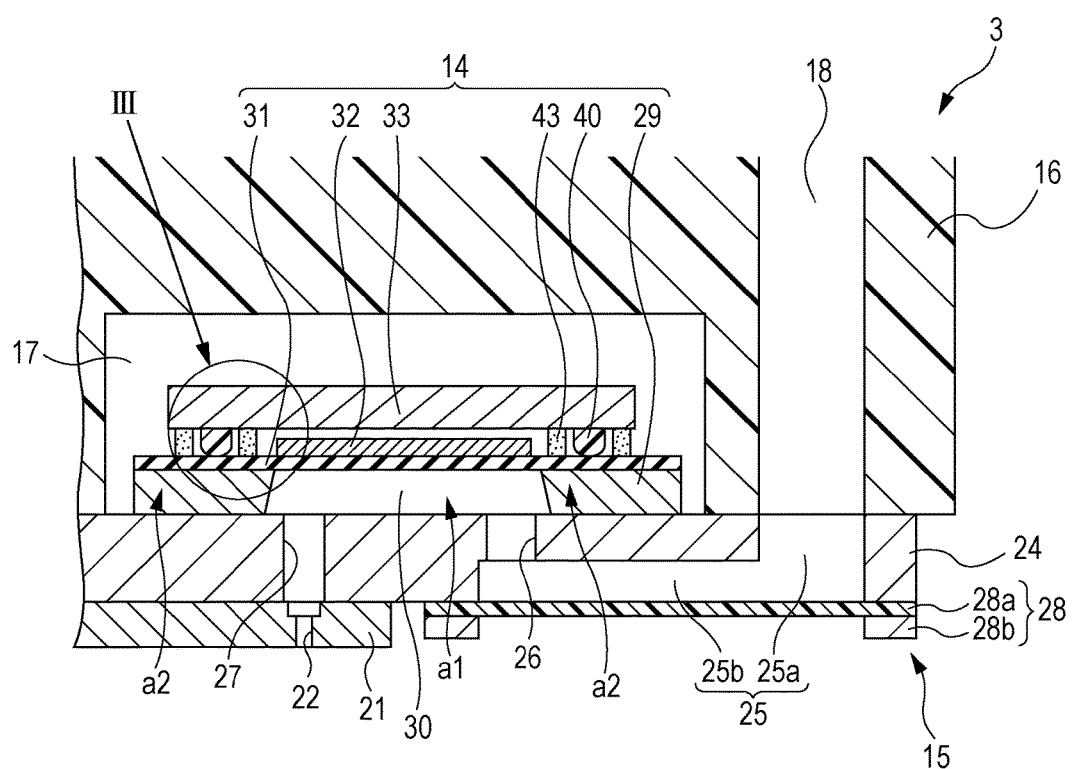
FIG. 2 is a sectional view illustrating a configuration of a recording head.
Figure 3:
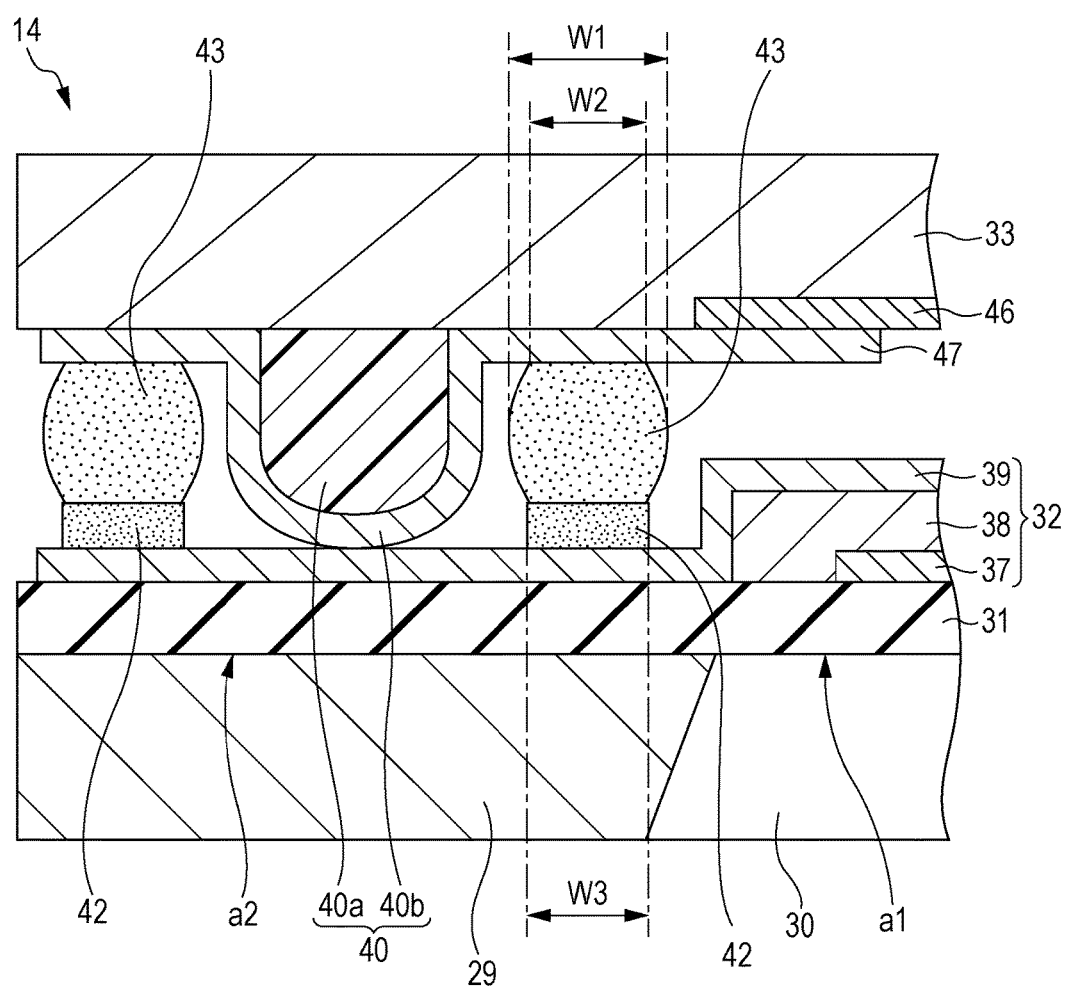
FIG. 3 is an enlarged sectional view of an essential portion of an electronic device.

Next, the recording head 3 will be described. FIG. 2 is a sectional view illustrating a configuration of a recording head 3. FIG. 3 is an enlarged view of an area III of FIG. 2, and is an enlarged sectional view of an essential portion of an electronic device 14 which is incorporated into the recording head 3. The recording head 3 according to the present embodiment is attached to a head case 16, in a state in which an electronic device 14 and a flow path unit 15 are stacked, as illustrated in FIG. 2. For the sake of convenience, description will be made by setting a stacking direction of each member to a vertical direction.

The head case 16 is a box-shaped member formed of a synthetic resin, and a reservoir 18 which supplies the ink to each pressure chamber 30 are formed in the head case 16. The reservoir 18 is a space in which the ink for being commonly supplied to a plurality of pressure chambers 30 provided in parallel with each other is stored, and is formed in a nozzle array direction. An ink introduction path (not illustrated) through which the ink is introduced to the reservoir 18 from the ink cartridge 7 side is formed over the head case 16. In addition, a containment space 17 which is recessed in a rectangular shape from a lower surface of the head case 16 to an intermediate position in a height direction is formed on the lower surface side of the head case 16. If the flow path unit 15 to be described later is bonded to the lower surface of the head case 16 in a state of being positioned thereto, the electronic device (a pressure chamber forming substrate 29, a sealing plate 33, or the like) stacked on a communication substrate 24 is configured to be contained in the containment space 17.

The flow path unit 15 bonded to the lower surface of the head case 16 includes the communication substrate 24, a nozzle plate 21, and a compliance sheet 28. The communication substrate 24 is a member formed of silicon, and is formed of a silicon single crystal substrate having a crystal plane orientation of a surface (an upper surface and a lower surface) as (110) plane, in the present embodiment. As illustrated in FIG. 2, a common liquid chamber 25 which communicates with the reservoir 18 and stores the ink for being commonly supplied to each pressure chamber 30, and individual communication paths 26 through which the ink from the reservoir 18 are individually supplied to each pressure chamber 30 through the common liquid chamber 25, are formed in the communication substrate 24 through etching. The common liquid chamber 25 is an elongated hollow portion in the nozzle array direction (a parallel direction of the pressure chamber 30). The common liquid chamber 25 is configured by a first liquid chamber 25a which passes through the communication substrate 24 in a plate thickness direction, and a second liquid chamber 25b which is recessed from a lower surface side of the communication substrate 24 to the intermediate position thereof toward an upper surface side thereof, and is formed in a state in which a thin plate portion remains on the upper surface side. Multiple individual communication paths 26 are formed in the thin plate portion of the second liquid chamber 25b in the parallel direction of the pressure chamber 30 in correspondence with the pressure chamber 30. The individual communication path 26 communicates with an end portion on one side in a longitudinal direction of a corresponding pressure chamber 30, in a state in which the communication substrate 24 and the pressure chamber forming substrate 29 are bonded together.

In addition, a nozzle communication path 27 which passes through a plate thickness direction of the communication substrate 24 is formed in a position corresponding to each nozzle 22 of the communication substrate 24. That is, multiple nozzle communication paths 27 are formed in correspondence with the nozzle columns in the nozzle array direction. The pressure chamber 30 and the nozzle 22 communicate with each other through the nozzle communication path 27. The nozzle communication path 27 according to the present embodiment communicates with an end portion on the other side (a side opposite to the individual communication path 26) in a longitudinal direction of a corresponding pressure chamber 30, in a state in which the communication substrate 24 and the pressure chamber forming substrate 29 are bonded together.

The nozzle plate 21 is a substrate (for example, silicon single crystal substrate) formed of silicon which is bonded to the lower surface (a side opposite to the pressure chamber forming substrate 29) of the communication substrate 24. The nozzle plate 21 according to the present embodiment is bonded to an area deviated from the compliance sheet 28 (the common liquid chamber 25) in the communication substrate 24. Multiple nozzles 22 are provided in a linear shape (column shape) in the nozzle plate 21. The multiple nozzles 22 (nozzle column) provided in a column shape are provided at an equal interval in the sub-scanning direction orthogonal to the main scanning direction, by a pitch (for example, 600 dpi) corresponding to dot formation density from the nozzle 22 on one end side to the nozzle 22 on the other side.

The compliance sheet 28 is bonded in a state of closing an opening on a lower surface side of a space which becomes the common liquid chamber 25, in an area corresponding to the common liquid chamber 25 which is an area deviated from an area to which the nozzle plate 21 of the communication substrate 24 is bonded. The compliance sheet 28 is configured by a flexible film 28a having flexibility, and a rigid fixing plate 28b to an upper surface of which the flexible film 28a is fixed. An opening is formed in a position corresponding to the common liquid chamber 25 of the fixing plate 28b such that a flexible deformation of the flexible film 28a is not inhibited. By doing so, a lower surface side of the common liquid chamber 25 becomes a compliance portion which is partitioned only by the flexible film 28a. By the compliance portion, a pressure change which occurs in the ink within the reservoir 18 and the common liquid chamber 25 can be absorbed.

The electronic device 14 according to the present embodiment is a device of a thin plate shape which functions as an actuator that creates a pressure change in the ink within each pressure chamber 30. The electronic device 14 is configured by a unit in which the pressure chamber forming substrate 29, a vibration plate 31, piezoelectric elements 32, and a sealing plate 33 are stacked, as illustrated in FIG. 2 and FIG. 3. The electronic device 14 is formed smaller than the containment space 17 so as to be contained in the containment space 17.

The pressure chamber forming substrate 29 is a rigid plate member formed of silicon, and is formed of a silicon single crystal substrate having a crystal plane orientation of a surface (an upper surface and a lower surface) as (110) plane, in the present embodiment. A space to become the pressure chamber 30 by completely removing a part through etching in a plate thickness direction is formed in the pressure chamber forming substrate 29. The space, that is, the pressure chamber 30 is provided in parallel with each other in correspondence with each nozzle 22 in the nozzle array direction in the plural. Each pressure chamber 30 is an elongated hollow portion in a direction orthogonal to the nozzle array direction, the individual communication path 26 communicates with an end portion on one side of a longitudinal direction of the pressure chamber 30, and the nozzle communication path 27 communicates with an end portion on the other side.

The vibration plate 31 is a member of a thin plate shape having elasticity, and is stacked on an upper surface (a surface on a side opposite to the communication substrate 24 side) of the pressure chamber forming substrate 29. By the vibration plate 31, an upper opening of the space to become the pressure chamber 30 is sealed. In other words, the pressure chamber 30 is partitioned by the vibration plate 31. A portion corresponding to the pressure chamber 30 (in detail, the upper opening of the pressure chamber 30) in the vibration plate 31 functions as a displacement portion which is displaced in a direction far from the nozzle 22 or a direction approaching the nozzle 22 by a flexural deformation of the piezoelectric element 32. That is, an area corresponding to the upper opening of the pressure chamber 30 in the vibration plate 31 becomes a drive area a1 in which a flexural deformation is allowed. Meanwhile, an area deviated from the upper opening of the pressure chamber 30 in the vibration plate 31 becomes a non-drive area a2 in which flexural deformation is not inhibited.

The vibration plate 31 is configured by, for example, an elastic film which is formed on an upper surface of the pressure chamber forming substrate 29 and is formed of a silicon dioxide ($SiO_2$), and an insulating film which is formed on the elastic film and is formed of a zirconium oxide ($ZrO_2$). Then, the piezoelectric elements 32 are respectively stacked over an area corresponding to each pressure chamber 30 on the insulating film (a surface on a side opposite to the pressure chamber forming substrate 29 side of the vibration plate 31), that is, the drive area a1. Each piezoelectric element 32 is formed in the nozzle array direction in the plural, in correspondence with the pressure chambers 30 provided in parallel in the nozzle array direction. The pressure chamber forming substrate 29 and the vibration plate 31 stacked thereon correspond to a first substrate according to the invention.

The piezoelectric element 32 according to the present embodiment is an electronic element of a so-called flexural mode. As illustrated in FIG. 3, the piezoelectric element 32 includes a lower electrode layer 37 (individual electrode), a piezoelectric body layer 38, and an upper electrode layer 39 (common electrode) which are sequentially stacked on, for example, the vibration plate 31. The piezoelectric element 32 configured in this way performs a flexural deformation in a direction far from the nozzle 22 or approaching the nozzle 22, if an electric field according to a potential difference between both the lower electrode layer 37 and the upper electrode layer 39 is applied. As illustrated in FIG. 3, an end portion on the other side (the left hand side in FIG. 2 and FIG. 3) of the upper electrode layer 39 extends from the drive area a1 to the non-drive area a2 across an area to which the piezoelectric body layer 38 is stacked. Meanwhile, while not illustrated, an end portion on one side (the right hand side in FIG. 2 and FIG. 3) of the lower electrode layer 37 extends from the drive area a1 to the non-drive area a2 on a side opposite to the non-drive area a2 on which the upper electrode layer 39 is stacked across the area on which the piezoelectric body layer 38 is stacked. That is, the lower electrode layer 37 extends to the non-drive area a2 on the one side, and the upper electrode layer 39 extends to the non-drive area a2 on the other side, in a longitudinal direction of the pressure chamber 30. Then, corresponding bump electrodes 40 (which will be described later) are respectively bonded to the extended lower electrode layer 37 and the extended upper electrode layer 39.

The sealing plate 33 (correspond to a second substrate of the invention) is a silicon substrate of a flat plate shape which is disposed separately from the vibration plate 31 (or the piezoelectric element 32). In the present embodiment, the sealing plate 33 is formed of a silicon single crystal substrate having a crystal plane orientation of a surface (an upper surface and a lower surface) as (110) plane. As illustrated in FIG. 3, a drive circuit 46 (driver circuit) for individually driving each piezoelectric element 32 is formed in an area facing the piezoelectric element 32 of the sealing plate 33. The drive circuit 46 is formed by using semiconductor processes (that is, a film forming process, a photolithography process, an etching process, and the like) on a surface of a silicon single crystal substrate (silicon wafer) which forms the sealing plate 33. In addition, a wiring layer 47 which is coupled to the drive circuit 46 is formed on the drive circuit 46 on a surface on the piezoelectric element 32 side of the sealing plate 33, in a state of being exposed on a surface of the sealing plate 33. The wiring layer 47 is formed long to a position facing the lower electrode layer 37 and the upper electrode layer 39 which are stacked on the non-drive area a2, in an outer side more than the drive circuit 46. Then, a portion thereof is formed on an internal resin 40a as a conductive film 40b of the bump electrode 40 which will be described later. The wiring layer 47 is illustrated in FIG. 3 as one unit for the sake of convenience, but includes multiple wires. Each wire included in the wiring layer 47 is electrically coupled to corresponding wires in the drive circuit 46. In addition, the wiring layer 47 uses a metal such as, gold (Au), copper (Cu), or nickel (Ni).

The pressure chamber forming substrate 29 on which the vibration plate 31 and the piezoelectric element 32 are stacked, and the sealing plate 33 are bonded together through the bump electrode 40, a first photosensitive adhesive 42, and a second photosensitive adhesive 43, as illustrated in FIG. 3. In detail, in a state in which the bump electrode 40 is interposed between the pressure chamber forming substrate 29 and the sealing plate 33, the pressure chamber forming substrate 29 and the sealing plate 33 are bonded together by the first photosensitive adhesive 42 and the second photosensitive adhesive 43 which overlaps the first photosensitive adhesive 42. That is, the pressure chamber forming substrate 29 and the sealing plate 33 are bonded together in a state of being separated from each other, by the first photosensitive adhesive 42 with photosensitivity and thermosetting which is stacked (overlapped) on an upper surface (a surface on the sealing plate 33 side) of the vibration plate 31, and the second photosensitive adhesive 43 with photosensitivity and thermosetting, which is stacked (overlapped) on the first photosensitive adhesive 42, in the same manner as the first photosensitive adhesive 42. An interval between the first photosensitive adhesive 42 and the second photosensitive adhesive 43 is set to the extent that a distortion deformation of the piezoelectric element 32 is not inhibited, and, is set to, for example, approximately 5 µm to approximately 25 µm. According to the present embodiment, the bump electrode 40, the first photosensitive adhesive 42, and the second photosensitive adhesive 43 are respectively formed in the non-drive area a2 on both sides in a longitudinal direction of the pressure chamber 30 in which the piezoelectric element 32 is interposed therebetween.

In more detail, the bump electrode 40 according to the present embodiment has elasticity, and protrudes toward the pressure chamber forming substrate 29 side from a surface of the sealing plate 33. In detail, as illustrated in FIG. 3, the bump electrode 40 includes the internal resin 40a with elasticity, and a conductive film 40b which is formed of the wiring layer 47 which covers a surface of the internal resin 40a. The internal resins 40a are formed respectively and protrusively in the nozzle array direction in an area facing the non-drive area a2 in which the lower electrode layer 37 is formed, and an area facing the non-drive area a2 in which the upper electrode layer 39 is formed, in the surface of the sealing plate 33. In addition, the conductive film 40b facing the lower electrode layer 37 (individual electrode) is formed in correspondence with the piezoelectric element 32 provided in parallel along the nozzle array direction, in the nozzle array direction in the plural. In the same manner, the conductive film 40b facing the upper electrode layer 39 (common electrode) is formed in the nozzle array direction in the plural. That is, the bump electrodes 40 are formed in the nozzle array direction in the plural. The internal resin 40a uses a resin such as, polyimide resin.

In addition, the first photosensitive adhesive 42 and the second photosensitive adhesive 43 stacked thereon are formed in a strip shape in the nozzle array direction, in both sides of the bump electrode 40 in a direction orthogonal to the nozzle array direction, as illustrated in FIG. 3. In detail, the first photosensitive adhesive 42 and the second photosensitive adhesive 43 are provided in the non-drive area a2 between the bump electrode 40 and the drive area a1 (or the piezoelectric body layer 38), and the non-drive area a2 on a side opposite to the drive area a1 with respect to the bump electrode 40. In the present embodiment, the first photosensitive adhesive 42 and the second photosensitive adhesive 43 are provided in a state of being separated from the bump electrode 40. Then, at least a portion of the second photosensitive adhesive 43 is formed in an expanded manner on an outer side more than the first photosensitive adhesive 42, between the vibration plate 31 and the sealing plate 33.

In more detail, an intermediate portion in a height direction of the second photosensitive adhesive 43 is formed in an expanded manner on an outer side more than the first photosensitive adhesive 42. That is, a width W1 (dimension in a direction orthogonal to the nozzle array direction) between the first photosensitive adhesive 42 and the sealing plate 33 of the second photosensitive adhesive 43 is formed in a greater manner than a width W2 of a boundary between the first photosensitive adhesive 42 and the second photosensitive adhesive 43 or a surface (alternatively, a surface of the wiring layer 47) of the sealing plate 33, and is formed in a larger manner than a width W3 of the first photosensitive adhesive 42. In the first photosensitive adhesive 42 according to the present embodiment, an intermediate portion in a height direction is not expanded toward an approximately outer side, and a shape of a cross section is formed in an approximately rectangular shape. In addition, the width W3 of the first photosensitive adhesive 42 is formed in approximately the same dimension as the width W2 of an end portion (a boundary between the first photosensitive adhesive 42 and the second photosensitive adhesive 43 or a surface of the sealing plate 33 (alternatively, a surface of the wiring layer 47)) in a height direction of the second photosensitive adhesive 43, or in a slightly larger dimension than the width W2.

In the present embodiment, the first photosensitive adhesive 42 and the second photosensitive adhesive 43 which are formed on the both sides between which the bump electrode 40 is interposed, are symmetrically disposed with respect to the bump electrode 40. In addition, the bump electrodes 40 which are provided in the non-drive area a2 on one side (right side of FIG. 2) between which the piezoelectric element 32 is interposed, and the bump electrode 40 which is provided in the non-drive area a2 of the other side (left side of FIG. 2) illustrated in FIG. 3 are formed in the same configuration as the first photosensitive adhesive 42 and the second photosensitive adhesive 43. Furthermore, the bump electrodes 40 use a material which is composed in the same manner as the first photosensitive adhesive 42 and the second photosensitive adhesive 43. The first photosensitive adhesive 42 and the second photosensitive adhesive 43 appropriately use a resin which contains, for example, an epoxy resin, an acrylic resin, a phenolic resin, a polyimide resin, a silicone resin, a styrene resin, or the like, as main components.

Then, the recording head 3 formed as described above introduces the ink from the ink cartridge 7 into the pressure chamber 30 through an ink introducing path, the reservoir 18, the common liquid chamber 25, and the individual communication path 26. In this state, as a drive signal from the drive circuit 46 is supplied to the piezoelectric element 32 through the bump electrode 40, the piezoelectric element 32 is driven, and thereby a pressure change occurs in the pressure chamber 30. By using the pressure change, the recording head 3 ejects the ink droplet from the nozzle 22 through the nozzle communication path 27.

Figure 4A:
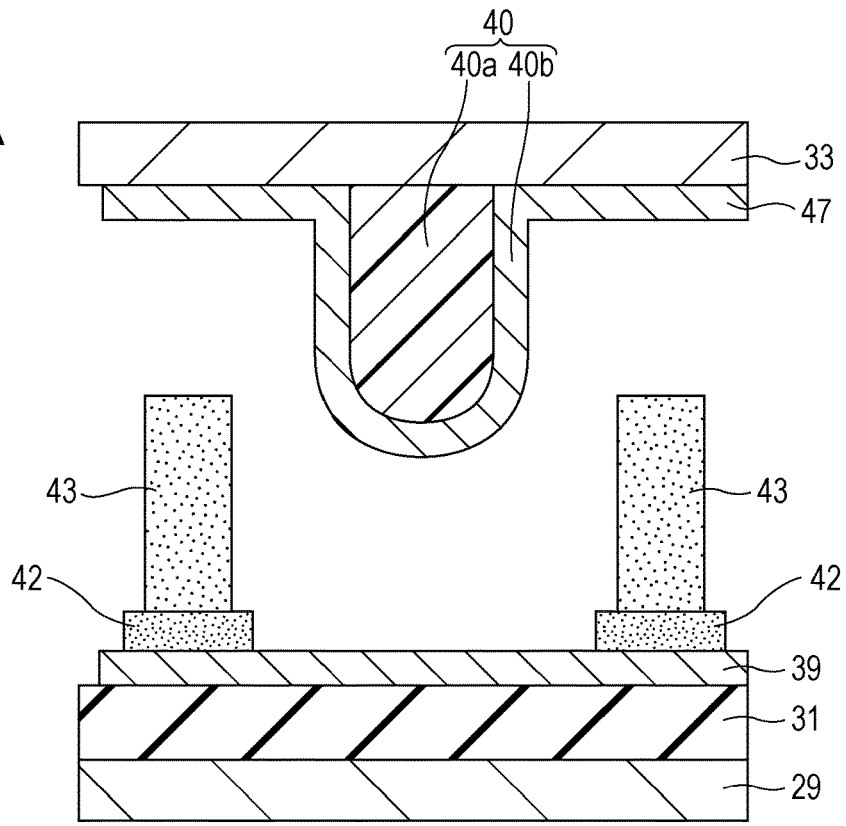
FIGS. 4A and 4B are schematic views illustrating manufacturing processes of the electronic device.
Figure 4B:
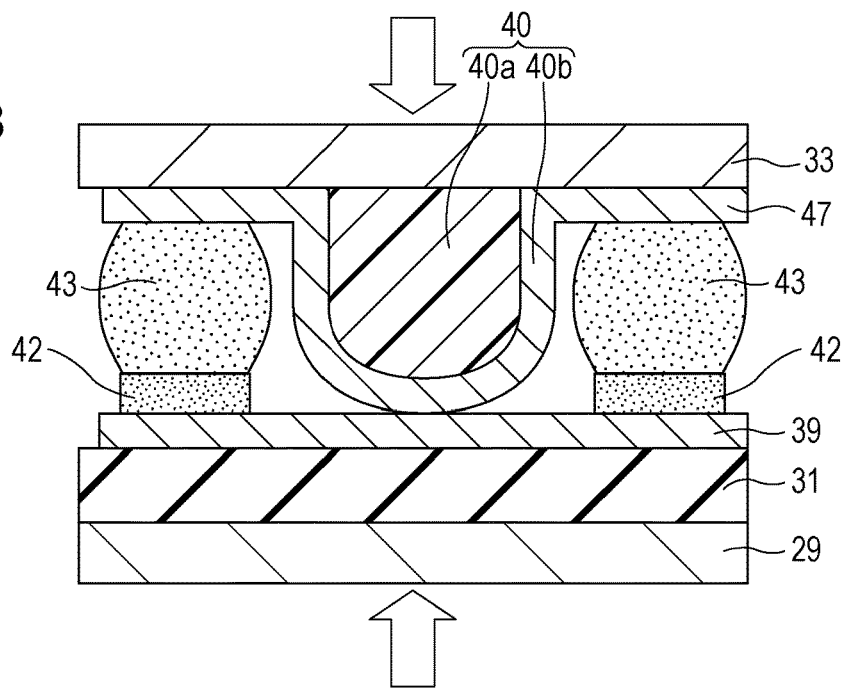

Next, the above-described recording head 3, particularly a manufacturing method of the electronic device 14 will be described. FIGS. 4A and 4B are schematic views illustrating manufacturing processes of the electronic device 14. The electronic device 14 is obtained by bonding a silicon single crystal substrate (silicon wafer) on which multiple areas that become the sealing plate 33 are formed, and a silicon single crystal substrate (silicon wafer) on which multiple areas that become the pressure chamber forming substrate 29 by stacking the vibration plate 31 and the piezoelectric element 32 are formed, and dicing the bonded substrate into individual chips.

In detail, in a silicon single crystal substrate of the sealing plate 33 side, the drive circuit 46 is first formed in a surface (a surface on a side facing the pressure chamber forming substrate 29 side) by semiconductor processes. Next, a resin film is formed on the surface, the internal resin 40a is formed by a photolithography process and an etching process, and thereafter, the corner is rounded by melting the internal resin 40a by heating. Thereafter, a metal film is formed on the surface by depositing, sputtering, or the like, and the wiring layer 47 (the conductive film 40b) is formed by a photolithography process and an etching process. By doing so, multiple areas, which become the sealing plate 33, corresponding to each recording head 3 are formed in a silicon single crystal substrate. Meanwhile, in the silicon single crystal substrate on the pressure chamber forming substrate 29 side, the vibration plate 31 is first stacked on a surface (a surface on a side facing the sealing plate 33 side). Next, the lower electrode layer 37, the piezoelectric body layer 38, the upper electrode layer 39, and the like are sequentially patterned by semiconductor processes, and thereby the piezoelectric element 32 is formed. By doing so, multiple areas, which become the pressure chamber forming substrate 29, corresponding to each recording head 3 are formed on a silicon single crystal substrate.

If the sealing plate 33 and the pressure chamber forming substrate 29 are formed in each silicon single crystal substrate, a photosensitive adhesive layer is formed on the surface (surface on the sealing plate 33 side) of the silicon single crystal substrate on the pressure chamber forming substrate 29 side, and the first photosensitive adhesive 42 is formed in a predetermined position by the photolithography process (correspond to a first process according to the invention). In detail, the photosensitive adhesive layer is formed by coating the vibration plate 31 with a photosensitive adhesive of a liquid type having photosensitivity and thermosetting by using a spin coater or the like, and heating the photosensitive adhesive. Then, by performing exposure and development, a shape of the first photosensitive adhesive 42 is patterned in a predetermined position (referring to FIG. 4A). At this time, by adjusting the amount of heating after a film is formed, and the amount of exposure at the time of exposing, cure reaction of the first photosensitive adhesive 42 is performed and the first photosensitive adhesive 42 is cured until a certain degree of cure, for example, 80% to 100%. By doing so, it is possible to prevent a shape of the first photosensitive adhesive 42 from being collapsed, or to prevent the first photosensitive adhesive 42 from being peeled from the surface of the silicon single crystal substrate. Here, the degree of cure is measured by using a differential scanning calorimeter (hereinafter, referred to as a DSC). In the measurement performed by the DSC, alumina ($Al_2O_3$) is used as a reference material. In the amount of reaction heat which is calculated from a temperature difference between a target and the reference material, a change no longer occur in the amount of reaction heat, that is, the degree of cure in which there is no temperature difference between the target and the reference material is defined as 100%. In addition, for a photosensitive adhesive, the amount of reaction heat of the resin immediately after exposure is defined as the degree of cure of 0%. Furthermore, definition which is set when the degree of cure is 50% goes to a state of being cured by the amount of reaction heat of half of the degrees of cure of 0% and 100%.

Next, by the same process, the second photosensitive adhesive 43 is formed so as to overlap the first photosensitive adhesive 42 (second stacking process (corresponds to a second process according to the invention)). In detail, the photosensitive adhesive layer is formed by coating the vibration plate 31 on which the first photosensitive adhesive 42 is stacked with a photosensitive adhesive of a liquid type having photosensitivity and thermosetting by using a spin coater or the like, and heating the photosensitive adhesive, in the same manner as the first stacking process. Then, by performing exposure and development, a shape of the second photosensitive adhesive 43 is patterned in a predetermined position in the same position as the first photosensitive adhesive 42 (referring to FIG. 4A). By doing so, the second photosensitive adhesive 43 is formed on the first photosensitive adhesive 42. At this time, by adjusting the amount of heating after a film is formed, and the amount of exposure at the time of exposing, the degree of cure of the second photosensitive adhesive 43 is decreased more than the degree of cure of the first photosensitive adhesive 42. For example, the degree of cure of the second photosensitive adhesive 43 is set to the degree of cure of 30% to 80%. In the present embodiment, by adjusting the amount of coating, the second photosensitive adhesive 43 is thicker than the first photosensitive adhesive 42.

In addition, the first photosensitive adhesive 42 and the second photosensitive adhesive 43 overlapping the first photosensitive adhesive 42 are formed separately from the bump electrode 40 in order to ensure a crushing margin of the bump electrode 40. An interval between the bump electrode 40, and the first photosensitive adhesive 42 and the second photosensitive adhesive 43 is set to a dimension to the extent that, even though the sealing plate 33 and the pressure chamber forming substrate 29 are pressed to crush the bump electrode 40, the first photosensitive adhesive 42, and the second photosensitive adhesive 43, those do not interfere with each other. However, since cure reaction of the first photosensitive adhesive 42 is performed to a certain degree of cure, it is difficult for the first photosensitive adhesive 42 to be crushed by pressing.

Then, if the first photosensitive adhesive 42 and the second photosensitive adhesive 43 are formed, both the silicon single crystal substrates are bonded together (bonding process). In detail, one silicon single crystal substrate relatively moves toward the other silicon single crystal substrate, and the first photosensitive adhesive 42 and the second photosensitive adhesive 43 are interposed between the both the silicon single crystal substrates, and bonded thereto. In this state, both the silicon single crystal substrates are vertically pressed against elastic restoring force of the bump electrode 40 (refer to an arrow of FIG. 4B). As a result, as illustrated in FIG. 4b, the bump electrode 40 is crushed by pressing, thereby being able to be coupled electrically and reliably to the lower electrode layer 37 on the pressure chamber forming substrate 29 side, the upper electrode layer 39, and the like. In addition, since a degree of cure of the second photosensitive adhesive 43 is set lower than that of the first photosensitive adhesive 42, the second photosensitive adhesive 43 expands toward the outer side more than the first photosensitive adhesive 42 by crushing by pressing. Then, the first photosensitive adhesive 42 and the second photosensitive adhesive 43 are heated to a cure temperature thereof, while being pressed. As a result, the first photosensitive adhesive 42 and the second photosensitive adhesive 43 are cured, in a state in which the bump electrode 40 is crushed by pressing, and thereby both the silicon single crystal substrates are bonded together.

If both the silicon single crystal substrates are bonded, a rear side (a side opposite to the silicon single crystal substrate on the sealing plate 33 side) of the silicon single crystal substrate on the pressure chamber forming substrate 29 side is ground, and thereby the silicon single crystal substrate on the pressure chamber forming substrate 29 side is thinned. Thereafter, by a photolithography process and an etching process, the pressure chamber 30 is formed in the silicon single crystal substrate on the thinned pressure chamber forming substrate 29 side. Finally, scribing is performed along a predetermined scribe line, and thereby the individual electronic device 14 is produced. In the method described above, two the silicon single crystal substrates are bonded together, diced, and thereby the electronic device 14 is produced, but the invention is not limited to this. For example, the sealing plate and the pressure chamber forming substrate are first diced respectively, and thereafter those may be bonded together. In this case, bonding of the sealing plate and the pressure chamber forming substrate using a photosensitive adhesive is also performed in the same method as that described above.

Then, the electronic device 14 which is manufactured by the above processes is positioned in the flow path unit 15 (communication substrate 24) using an adhesive or the like for being fixed. Then, in a state in which the electronic device 14 is contained in the containment space 17 of the head case 16, the head case 16 and the flow path unit 15 are bonded together, and thereby the above-described recording head 3 is manufactured.

In this way, the second photosensitive adhesive 43 whose degree of cure is lower than that of the first photosensitive adhesive 42 is formed on the first photosensitive adhesive 42, and thus it is possible to increase bonding strength between the pressure chamber forming substrate 29 on which the vibration plate 31 and the piezoelectric element 32 is stacked by the second photosensitive adhesive 43, and the sealing plate 33. That is, even though the cure reaction of the first photosensitive adhesive 42 is performed in order to increase patterning accuracy of the first photosensitive adhesive 42, adhesion can be ensured by the second photosensitive adhesive 43. As a result, it is possible to achieve an increase of patterning accuracy of a photosensitive adhesive, and an increase of bonding strength. In addition, in the same manner as in the present embodiment, if a photosensitive adhesive adheres to an area in which the wiring layer 47 of the sealing plate 33 is formed, adhesiveness of the photosensitive adhesive and a surface of the sealing plate 33 is decreased by roughness of the wiring layer 47, and bonding strength can be decreased. However, in the present embodiment, since the adhesiveness of the second photosensitive adhesive 43 and the surface of the sealing plate 33 can be increased by decreasing the degree of cure of the second photosensitive adhesive 43, it is possible to suppress a decrease of bonding strength.

However, in the first embodiment described above, the bump electrode 40 is provided on the sealing plate 33 side, but the invention is not limited to this. For example, the bump electrode can be provided on the pressure chamber substrate side. In addition, in the present embodiment described above, the bump electrode 40 is configured by the internal resin 40a and the conductive film 40b, but the invention is not limited to this. For example, the bump electrode can be formed by a metal such as, gold (Au) or a solder. Furthermore, in the manufacturing method according to the first embodiment described above, the silicon single crystal substrate on the pressure chamber forming substrate 29 side is coated with the first photosensitive adhesive 42 and the second photosensitive adhesive 43, but the invention is not limited to this. For example, it is possible to coat the silicon single crystal substrate on the sealing plate side with the first photosensitive adhesive and the second photosensitive adhesive. In this case, the first substrate becomes the silicon single crystal substrate on the sealing plate side, and the second substrate becomes the silicon single crystal substrate on the pressure chamber forming substrate side.

In addition, in the first embodiment described above, the first photosensitive adhesive 42 and the second photosensitive adhesive 43 are used for the bonding of the pressure chamber forming substrate 29 and the sealing plate 33, but the invention is not limited to this. For example, in an electronic device 14' according to a second embodiment illustrated in FIG. 5, a third photosensitive adhesive 44 is provided between a second photosensitive adhesive 43' and the sealing plate 33, and the pressure chamber forming substrate 29 and 33 are bonded together by a first photosensitive adhesive 42', a second photosensitive adhesive 43', and the third photosensitive adhesive 44.

Figure 5:
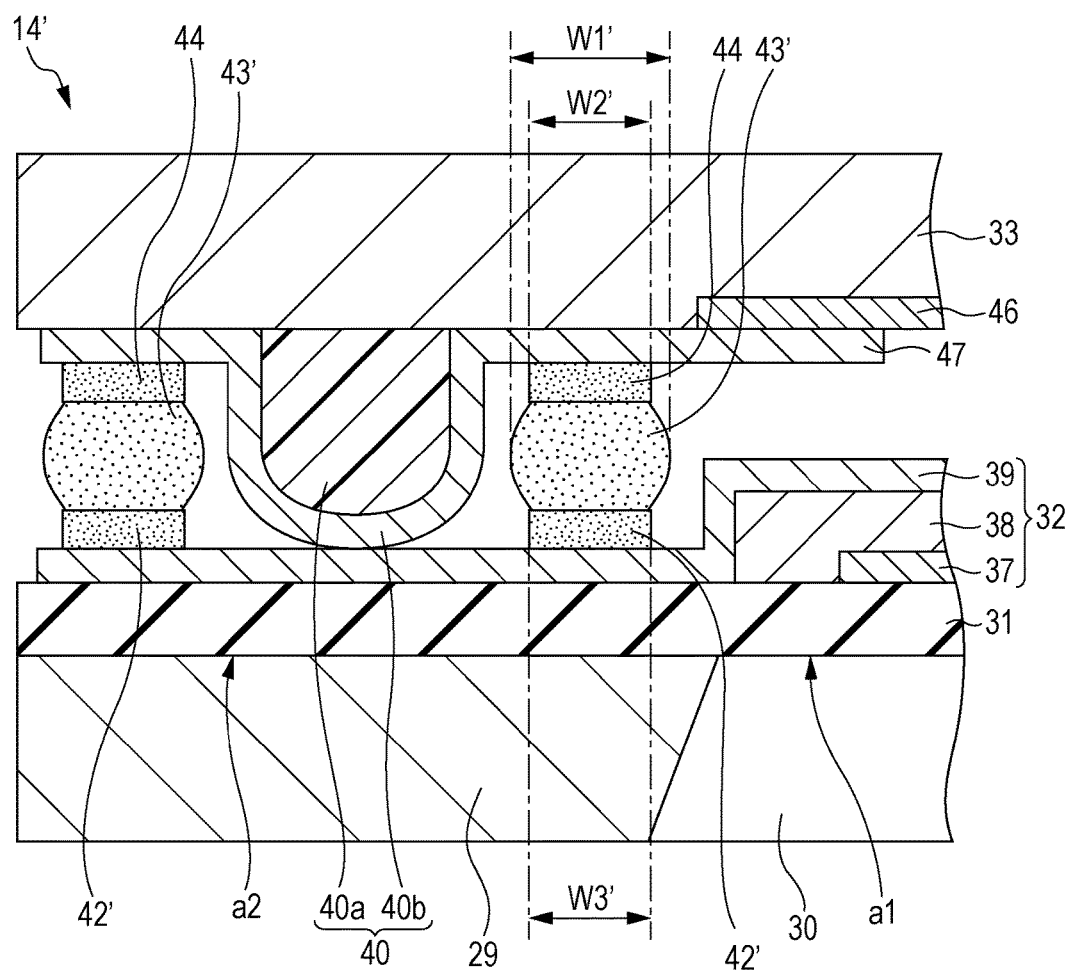
FIG. 5 is an enlarged schematic view of an essential portion of an electronic device according to a second embodiment.

That is, the pressure chamber forming substrate 29 on which the vibration plate 31 and the piezoelectric element 32 are stacked, and the sealing plate 33 are bonded together through the first photosensitive adhesive 42', the second photosensitive adhesive 43', and the third photosensitive adhesive 44, as illustrated in FIG. 5. The first photosensitive adhesive 42' and the third photosensitive adhesive 44 according to the present embodiment are formed in approximately the same shape as the first photosensitive adhesive 42' according to the first embodiment described above. In detail, a width W3' of the first photosensitive adhesive 42' and the third photosensitive adhesive 44 is smaller than a width W1' of an intermediate portion in a height direction of the second photosensitive adhesive 43', and thicknesses thereof are thinner than a thickness of the second photosensitive adhesive 43'. In addition, intermediate portions in a height direction of the first photosensitive adhesive 42' and the third photosensitive adhesive 44 hardly expand on an outer side, and a shape of a cross section is formed in a rectangular shape.

Meanwhile, an intermediate portion in a height direction of the second photosensitive adhesive 43' is formed in an expanded manner on an outer side more than those of the first photosensitive adhesive 42' and the third photosensitive adhesive 44, in the same manner as in the first embodiment described above. That is, a width W1' between the first photosensitive adhesive 42' and the third photosensitive adhesive 44 is greater than a width W2' of a boundary between the first photosensitive adhesive 42' and the second photosensitive adhesive 43' or a boundary between the third photosensitive adhesive 44 and the second photosensitive adhesive 43'. The third photosensitive adhesive 44 uses a material with photosensitivity and thermosetting in the same manner as the first photosensitive adhesive 42' and the second photosensitive adhesive 43', and uses a material which is composed in the same manner as the first photosensitive adhesive 42' and the second photosensitive adhesive 43', in the present embodiment. In addition, since the other configurations are the same as in the first embodiment described above, description thereof will be omitted.

Figure 6A:
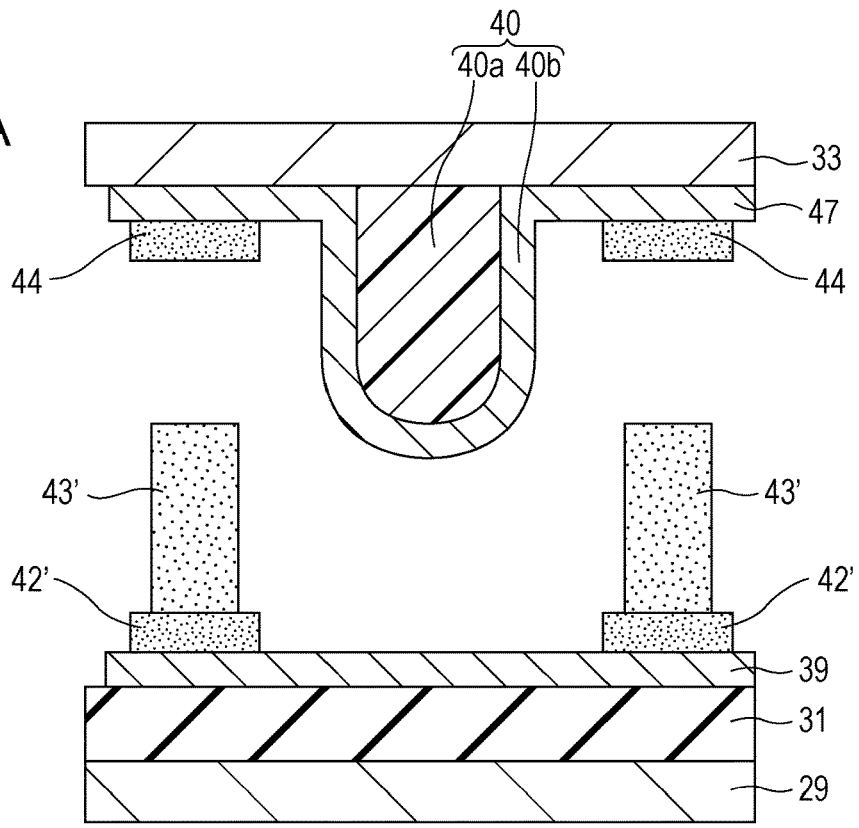
FIGS. 6A and 6B are schematic views illustrating manufacturing processes of the electronic device according to the second embodiment.
Figure 6B:
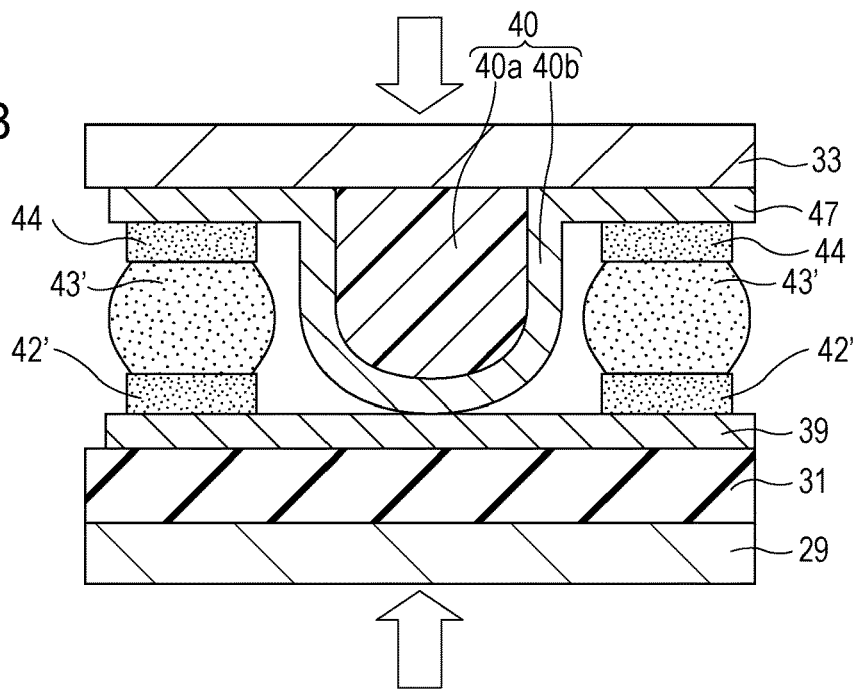

Next, a manufacturing method of an electronic device 14' according to the present embodiment will be described. FIGS. 6A and 6B are schematic views illustrating manufacturing processes of the electronic device 14' according to the resent embodiment. Also in the manufacturing method according to the present embodiment, in the same manner as the manufacturing method according to the first embodiment described above, a silicon single crystal substrate (silicon wafer) on which multiple areas that become the sealing plate 33 are formed, and a silicon single crystal substrate (silicon wafer) on which multiple areas that become the pressure chamber forming substrate 29 by stacking the vibration plate 31 and the piezoelectric element 32 are formed, are bonded together, and thereafter the bonded substrates are diced into individual chips.

In detail, in the same manner as the manufacturing method according to the first embodiment described above, the drive circuit 46, the wiring layer 47, the bump electrode 40, and the like are first formed in a silicon single crystal substrate of the sealing plate 33 side. In addition, the piezoelectric element 32 is formed in the silicon single crystal substrate on the pressure chamber forming substrate 29 side. Next, in the same manner as the first stacking process according to the first embodiment described above, the first photosensitive adhesive 42' is formed in a predetermined position on a surface of the silicon single crystal substrate on the pressure chamber forming substrate 29 side (first stacking process). In addition, in the same manner as the second stacking process according to the first embodiment described above, the second photosensitive adhesive 43' whose degree of cure is lower than that of the first photosensitive adhesive 42' is formed so as to overlap the first photosensitive adhesive 42' (second stacking process).

Meanwhile, in the same manner as the first stacking process according to the present embodiment, the third photosensitive adhesive 44 is also formed on a predetermined position on a surface (surface on the pressure chamber forming substrate 29) of the silicon single crystal substrate on the sealing plate 33 side (third stacking process (corresponds to a third process according to the invention)). That is, the photosensitive adhesive layer is formed by coating the sealing plate 33 with a photosensitive adhesive of a liquid type having photosensitivity and thermosetting using a spin coater or the like, and heating the photosensitive adhesive. Then, by performing exposure and development, a shape of the third photosensitive adhesive 44 is patterned in a predetermined position (referring to FIG. 6A). At this time, in the same manner as the first sacking process, by adjusting the amount of heating after a film is formed, and the amount of exposure at the time of exposing, cure reaction of the third photosensitive adhesive 44 is performed and the third photosensitive adhesive 44 is cured until the degree of cure which is equal to that of the first photosensitive adhesive 42'. By doing so, the third photosensitive adhesive 44 with a degree of cure higher than that of the second photosensitive adhesive 43' is formed on a surface of the silicon single crystal substrate on the sealing plate 33 side. As a result, it is possible to prevent a shape of the third photosensitive adhesive 44 from being collapsed, or to prevent the third photosensitive adhesive 44 from being peeled from the surface of the silicon single crystal substrate.

Then, the first photosensitive adhesive 42' and the second photosensitive adhesive 43' are formed on a surface of the silicon single crystal substrate on the pressure chamber forming substrate 29 side, and if the third photosensitive adhesive 44 is formed on the surface of the silicon single crystal substrate of the sealing plate 33, both the silicon single crystal substrates are bonded together (bonding process). In detail, one silicon single crystal substrate relatively moves toward the other silicon single crystal substrate, and the second photosensitive adhesive 43' comes into close contact with the third photosensitive adhesive 44. In this state, both the silicon single crystal substrates are vertically pressed against elastic restoring force of the bump electrode 40 (refer to an arrow of FIG. 6B). As a result, the bump electrode 40 is crushed by pressing, and thereby the second photosensitive adhesive 43' with a low degree of cure is crushed by pressing. Accordingly, the second photosensitive adhesive 43' expands on an outer side more than the first photosensitive adhesive 42'. Then, the first photosensitive adhesive 42', the second photosensitive adhesive 43', and the third photosensitive adhesive 44 are heated to a cure temperature thereof, while being pressed. As a result, the first photosensitive adhesive 42', the second photosensitive adhesive 43', and the third photosensitive adhesive 44 are cured, in a state in which the bump electrode 40 is crushed by pressing, and thereby both the silicon single crystal substrates are bonded together. Since the other methods are the same the manufacturing method according to the first embodiment described above, description thereof will be omitted.

In this way, in the present embodiment, the sealing plate 33 is directly coated with the third photosensitive adhesive 44, and thus it is possible to reliably ensure bonding strength between the sealing plate 33 and the third photosensitive adhesive 44. In addition, by adhering of the second photosensitive adhesive 43' and the third photosensitive adhesive 44, that is, adhering between the adhesives, the pressure chamber forming substrate 29 on which the vibration plate 31 and the piezoelectric element 32 are stacked, and the sealing plate 33 are bonded together, and thus it is possible to increase bonding strength between both the pressure chamber forming substrate 29 and the sealing plate 33.

Figure 7A:
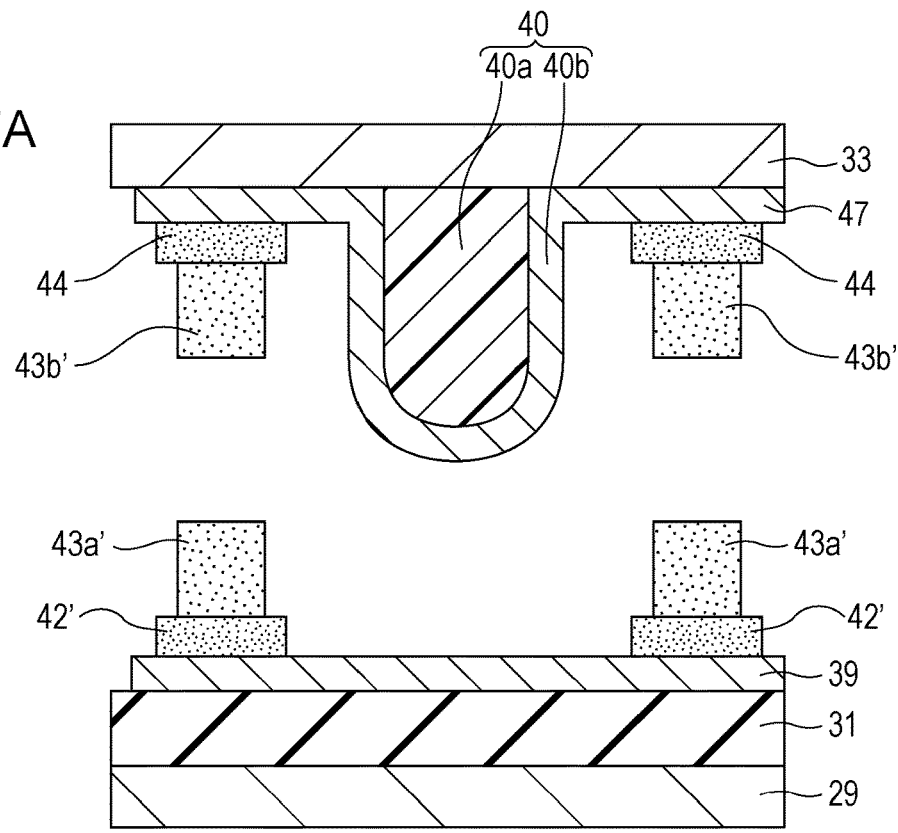
FIGS. 7A and 7B are schematic views illustrating manufacturing processes of an electronic device according to a modified example of the second embodiment.
Figure 7B:
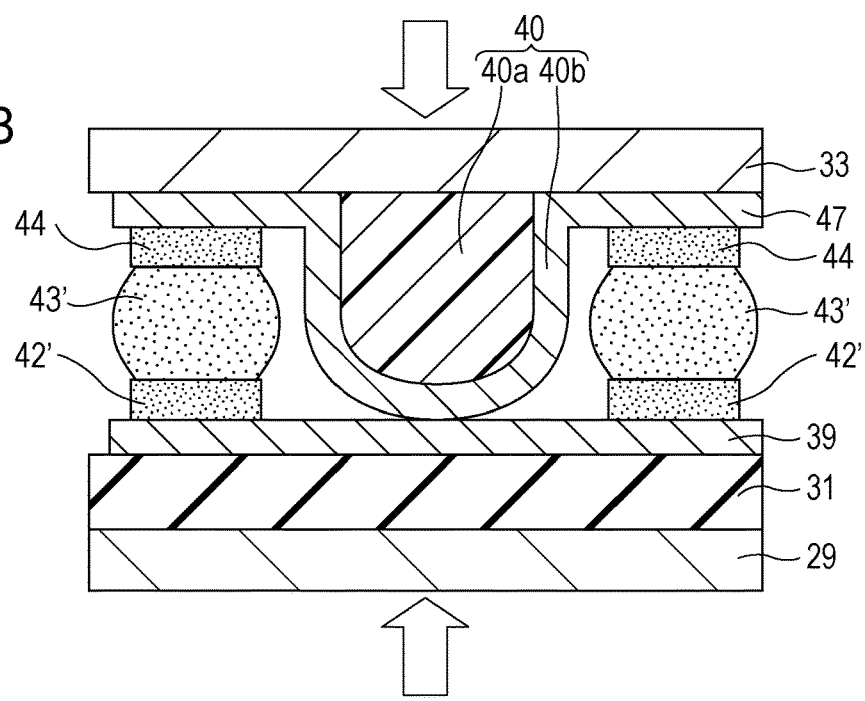

However, the manufacturing method of the electronic device 14' in which the third photosensitive adhesive 44 is interposed between the second photosensitive adhesive 43' and the sealing plate 33 is not limited to the embodiment described above. For example, in a modification example of a manufacturing method according to a second embodiment illustrated in FIGS. 7A and 7B, a process of forming the second photosensitive adhesive 43' which overlaps the third photosensitive adhesive 44 included.

In detail, in the same manner as the manufacturing method according to the second embodiment described above, the drive circuit 46, the wiring layer 47, the bump electrode 40, and the like are first formed in the silicon single crystal substrate on the sealing plate 33 side, and the piezoelectric element 32 is formed in the silicon single crystal substrate on the pressure chamber forming substrate 29 side. Next, in the same manner as the first stacking process according to the second embodiment described above, the first photosensitive adhesive 42' is formed in a predetermined position on a surface of the silicon single crystal substrate on the pressure chamber forming substrate 29 side (first stacking process). In addition, in the same manner as the second stacking process according to the second embodiment described above, a second photosensitive adhesive 43a' is formed with a lower degree of cure than that of the first photosensitive adhesive 42' so as to overlap the first photosensitive adhesive 42' (second stacking process). Here, in the second stacking process according to the present modification example, a thickness of the second photosensitive adhesive 43a' is thinned than that of the second photosensitive adhesive 43' which is stacked in the second stacking process according to the second embodiment described above.

Meanwhile, in the same manner as the third stacking process according to the second embodiment described above, the third photosensitive adhesive 44 with a higher degree of cure than that of the second photosensitive adhesive 43a' is formed on a surface (a surface on the pressure chamber forming substrate 29 side) of the silicon single crystal substrate on the sealing plate 33 side (third stacking process). Then, in the same manner as the second stacking process described above, a second photosensitive adhesive 43b' is formed so as to overlap the third photosensitive adhesive 44n (fourth stacking process (corresponding to a fourth process according to the invention)). That is, a photosensitive adhesive layer is formed by coating the sealing plate 33 with a photosensitive adhesive of a liquid type having photosensitivity and thermosetting using a spin coater or the like, and heating the photosensitive adhesive. Then, by performing exposure and development, a shape of the second photosensitive adhesive 43b' is also patterned in the silicon single crystal substrate on the sealing plate 33 side (referring to FIG. 7A). In the present embodiment, a thickness of the second photosensitive adhesive 43b' which is stacked on the sealing plate 33 side is aligned in approximately the same manner as a thickness of the second photosensitive adhesive 43a' on the pressure chamber forming substrate 29 side.

Then, the first photosensitive adhesive 42' and the second photosensitive adhesive 43a' are formed on a surface of the silicon single crystal substrate on the pressure chamber forming substrate 29 side, and if the third photosensitive adhesive 44 and the second photosensitive adhesive 43b' are formed on a surface of the silicon single crystal substrate on the sealing plate 33 side, both the silicon single crystal substrates are bonded together (bonding process). In detail, one silicon single crystal substrate relatively moves toward the other silicon single crystal substrate, and the second photosensitive adhesive 43a' which is formed on the pressure chamber forming substrate 29 side comes into close contact with the second photosensitive adhesive 43b' which is formed on the sealing plate 33 side. In this state, both the silicon single crystal substrates are vertically pressed against elastic restoring force of the bump electrode 40 (refer to an arrow of FIG. 7B). As a result, both the second photosensitive adhesive 43a' and the second photosensitive adhesive 43b' are intermixed so as to become one second photosensitive adhesive 43', are crushed by pressing, thereby expanding on an outer side more than the first photosensitive adhesive 42'. Then, the first photosensitive adhesive 42', the second photosensitive adhesive 43', and the third photosensitive adhesive 44 are heated to a cure temperature thereof, while being pressed. As a result, the first photosensitive adhesive 42', the second photosensitive adhesive 43', and the third photosensitive adhesive 44 are cured, in a state in which the bump electrode 40 is crushed by pressing, and thereby both the silicon single crystal substrates are bonded together. Since the other methods are the same the manufacturing method according to the second embodiment described above, description thereof will be omitted.

In this way, in the present embodiment, the sealing plate 33 is directly coated with the third photosensitive adhesive 44, and thus it is also possible to reliably ensure bonding strength between the sealing plate 33 and the third photosensitive adhesive 44. In addition, by adhering between the second photosensitive adhesives 43', that is, adhering between the adhesives with low degree of cure, the pressure chamber forming substrate 29 on which the vibration plate 31 and the piezoelectric element 32 are stacked, and the sealing plate 33 are bonded together, and thus it is possible to further increase bonding strength between both the pressure chamber forming substrate 29 and the sealing plate 33.

However, in each embodiment described above, the second photosensitive adhesive 43 has the greatest thickness, but the invention is not limited to this. The thicknesses of each photosensitive adhesive can be arbitrarily set. In addition, in each embodiment described above, the compositions of the first photosensitive adhesives 42 and 42', the second photosensitive adhesives 43 and 43', and the third photosensitive adhesive 44 are the same as each other, but the invention is not limited to this. For example, the composition of the first photosensitive adhesive may be the same as that of the third photosensitive adhesive, and the compositions of the first photosensitive adhesive and the third photosensitive adhesive may be different from the composition of the second photosensitive adhesive. Alternatively, the compositions of each photosensitive adhesive may be respectively different from each other. In short, when the pressure chamber forming substrate and the sealing plate are bonded together, if only the degree of cure of the second photosensitive adhesive is lower than that of the other photosensitive adhesive, any composition may be used.

Furthermore, in each embodiment described above, the photosensitive adhesives 42, 43, and 44 are provided symmetrically on the left and right with respect to the bump electrode 40, but the invention is not limited to this. An adhesive area of a photosensitive adhesive which is formed on one side of an outer side and an inner side with respect to the bump electrode can be formed greatly more than that of a photosensitive adhesive which is formed on the other side. For example, by forming a great adhesive area of the photosensitive adhesive which is formed on an outer side more than a bump electrode having a relative space margin, it is possible to increase bonding strength between a sealing plate and a pressure chamber forming substrate.

Furthermore, in each embodiment described above, the drive circuit 46 is formed in the sealing plate 33, but the invention is not limited to this. The invention can employ a configuration in which a layer that becomes an electrode is formed in a sealing plate, and the electrode and another electrode on a pressure chamber forming substrate are electrically coupled to each other by a bump electrode. For example, a substrate in which a drive circuit is formed may be bonded onto a sealing plate, and only a wire may be provided on the sealing plate. In this case, the drive circuit is electrically coupled to another drive circuit and a piezoelectric element which are formed in a substrate different from the sealing plate, through a wire formed in the sealing plate and a bump electrode.

In the above description, the ink jet type recording head mounted in the ink jet printer is exemplified as a liquid ejection head, but the invention can be applied to a device in which ejects liquid other than the ink. The invention can also be applied to, for example, a color material ejecting head which is used for manufacturing a color filter of a liquid crystal display or the like, an organic electro luminescence (EL) display, an electrode material ejecting head which is used for forming an electrode of a field emission display (FED) or the like, a bio-organic material ejecting head which is used for manufacturing a biochip (biochemical element), or the like.

In addition, the invention is not limited to a device which is used for an actuator of a liquid ejecting head, and can also be applied to an electronic device which is used for, for example, various sensors.

The present application claims priority to Japanese Patent Application No. 2015-043353 filed on Mar. 5, 2015, which is hereby incorporated by reference in its entirety.

What is claimed is:

1. An electronic device comprising:
a first substrate;
a second substrate which is bonded to the first substrate;
a bump electrode extending from one of the first or second substrates to the other of the first or second substrates;
a first photosensitive adhesive which is formed on the first substrate; and
a second photosensitive adhesive which is formed on the first photosensitive adhesive so as to overlap the first photosensitive adhesive;
the second substrate being bonded to the first substrate in a state in which the first photosensitive adhesive and the second photosensitive adhesive are interposed between the first substrate and the second substrate,
wherein the second photosensitive adhesive is formed between the first substrate and the second substrate, the first photosensitive adhesive having a first width, the second photosensitive adhesive having a first end that contacts the first photosensitive adhesive and a second end that contacts the second substrate, the first and second ends having a second width that is substantially equal to the first width, the second photosensitive adhesive having a center portion in a height direction between the first and second ends that has a third width that is greater than the second width such that at least the center portion of the second photosensitive adhesive expands on an outer side more than the first photosensitive adhesive,
wherein a space accommodating an element is formed by the first photosensitive adhesive, the second photosensitive adhesive, the first substrate, and the second substrate.

2. The device according to claim 1, wherein a third photosensitive adhesive is included between the second photosensitive adhesive and the second substrate.

3. The device according to claim 1, the first and second photosensitive adhesives also being formed as recited over the first substrate at each of two sides of the bump electrode on the first substrate.

4. The device according to claim 3, the first and second photosensitive adhesives being in a state of being not in contact with the bump electrode.

5. The device according to claim 3, the first and second photosensitive adhesives being in a state of being symmetrically disposed on the two sides with respect to the bump electrode.

6. The device according to claim 1, the bump electrode extending from the second substrate to the first substrate.

* * * * *